United States Patent

Hannigsberg

[11] 3,952,248
[45] Apr. 20, 1976

[54] D.C. VOLTAGE RATIO MEASURING CIRCUIT

[75] Inventor: Claude Hannigsberg, Vernouillet, France

[73] Assignee: Lignes Telegraphiques et Telephoniques, Paris, France

[22] Filed: Sept. 27, 1974

[21] Appl. No.: 509,960

[30] Foreign Application Priority Data
Oct. 4, 1973  France .............................. 73.35427

[52] U.S. Cl. ............................. 324/140 D; 328/161
[51] Int. Cl.² ....................... G01R 7/04; G06G 7/16
[58] Field of Search ............ 324/140 R, 140 D, 132, 324/118; 307/235; 340/172; 328/161; 235/196

[56] References Cited
UNITED STATES PATENTS

| | | | |
|---|---|---|---|
| 2,521,522 | 9/1950 | Keitley .......................... | 324/140 D |
| 3,710,253 | 1/1973 | O'Neill ........................... | 324/140 D |

Primary Examiner—R. V. Rolinec
Assistant Examiner—Ernest F. Karlsen
Attorney, Agent, or Firm—Abraham A. Saffitz

[57] ABSTRACT

A circuit sensitive to the ratio of the values of two voltages of fixed polarities and possibly variable magnitudes, including two identical voltage dividers respectively fed from one and the other of said voltages and a third divider fed from a constant amplitude alternative voltage source. Each divider consists of a constant resistance and of a variable voltage sensitive resistance. The relative positions of the constant and variable resistances are the same in the two first dividers and are reversed in the third one; the latter is biassed by a voltage derived from at least one of the voltages to be compared. From the voltages received at the mid-points of the two first dividers, a resulting voltage is derived, the value of which has a simple relation to the ratio of the compared voltages.

11 Claims, 6 Drawing Figures

D.C. VOLTAGE RATIO MEASURING CIRCUIT

The invention relates to a circuit enabling it to be determined if the ratio of the magnitudes of two possibly variable direct current voltages of a same given polarity is greater or smaller than a given value and for converting said ratio into a representing voltage.

The object of the present invention is to provide a circuit for comparing two D.C. voltages with respect only to the ratio of their magnitudes, whatever their values within their own variation range may be at any instant.

Another object of the invention is thus to provide such a circuit which can be produced by means of monolithic, hybrid or integrated circuit techniques.

The circuit according to the invention comprises three voltage dividers connected to a common ground point, each of these dividers consisting of a fixed resistor and of a variable resistor affected by the current intensity passing through it, and is characterized in that a first and a second of said dividers are respectively fed with a constant polarity current by one and the other of the D.C. voltages to be compared, the polarities of which are assumed to be fixed ones, and in that the third of said dividers is fed on one hand with direct current by a D.C. voltage derived from at least one of said voltages to be compared and, on the other hand, with alternating current by a source of constant amplitude, and in that the alternating voltage received at the mid-point of said third divider feeds said first and second dividers, the series-connection order of said fixed and variable resistors being the same in said first and second dividers and being reversed in the third divider with respect to that in the first two dividers.

The above-said representing (or "resultant") voltage is thereafter derived by amplification, rectification and appropriate filtering in an output circuit, from the two alternating current voltages delivered respectively to the mid-points of said first and second dividers.

In accordance with another feature of the invention, the fixed resistors of the circuit are determined in such a manner that the ohmic values of the variable resistors vary in proportions as large as possible with the variations of the two D.C. voltages whose values are being compared. To this end, the variable resistors used are preferably semi-conductor rectifying diodes, biassed in such a manner that their differential resistance varies over a wide range. The differential resistance is defined as the slope of the voltage-current curve of a variable resistor.

As will be seen, said resultant voltage is a relatively simple function of the magnitudes of the ratio of the two D.C. voltages to be compared, that is to say, of the logarithmic difference of their levels. The invention can thus be applied not only to detecting whether the difference of said levels between two direct current voltages is greater or less than a given value, but also to the measuring of this level difference by using a voltage measuring instrument of any known type, previously calibrated in accordance with the function relating said resultant voltage to the difference of the levels of the two voltages being compared.

The nature and advantages of the invention will be better understood by reading the following description given with reference to the annexed drawings, said description and drawings being given only by way of non-limitative examples. In the drawings.

Figure 1:
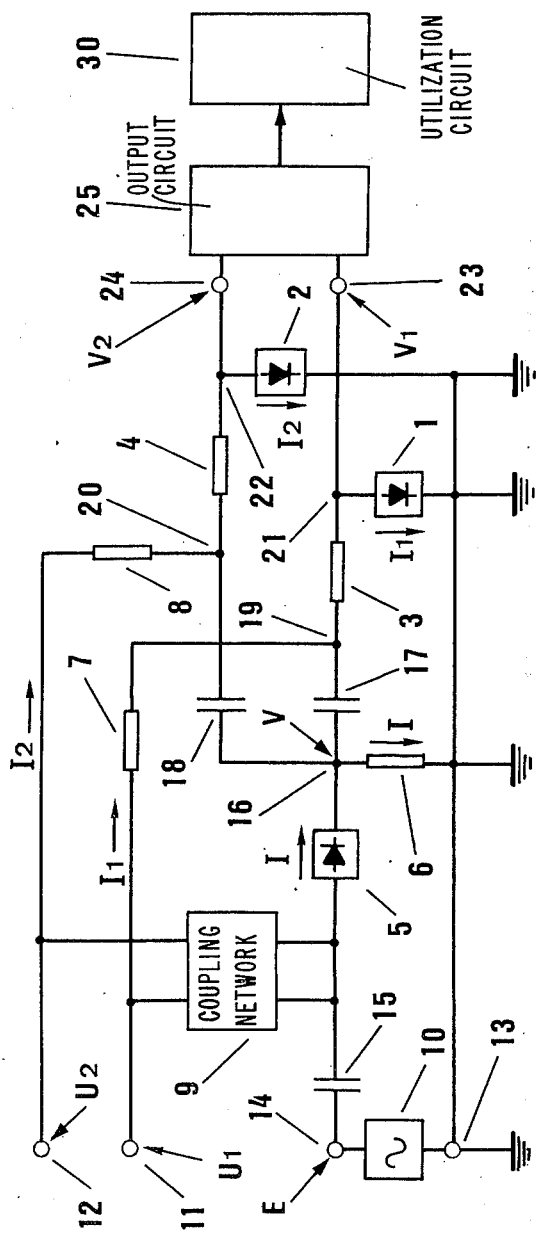
FIG. 1 shows a basic diagram of a voltage ratio measuring circuit according to the invention.

Referring first to FIG. 1, the first divider comprises the resistor 3 and the semi-conductor diode 1; the second divider, the resistor 4 and the diode 2; and the third divider, the diode 5 and the resistor 6. The two voltages $U_1$ and $U_2$ to be compared and whose polarities are assumed to be positive, are respectively applied between the input terminals 11, 12, and the ground point 13; they respectively feed the first and second dividers by means of the resistors 7 and 8 and bias respectively the diodes 1 and 2.

Designating by R followed by a reference number the direct current resistance of the corresponding component, diode or fixed resistor, and by Rd followed by a reference number, the differential resistance as above defined of the corresponding diode the components given below are selected such that:

$$R7 \gg R1 \quad \text{and} \quad R3 \gg R1 \quad (1)$$
$$R8 \gg R2 \quad \text{and} \quad R4 \gg R2$$
$$R6 \ll Rd5$$
$$R3 \gg Rd1$$
$$R4 \ll Rd2$$

$$\frac{R7 + R3}{R3} = \frac{R8 + R4}{R4} = k \quad (2)$$

Figure 4:
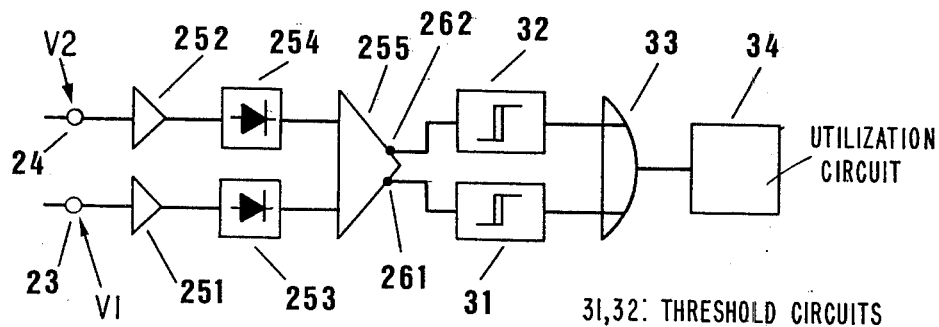
FIG. 4 is a first example of embodiment of the output circuit of the circuit according to FIG. 1.
Figure 5:
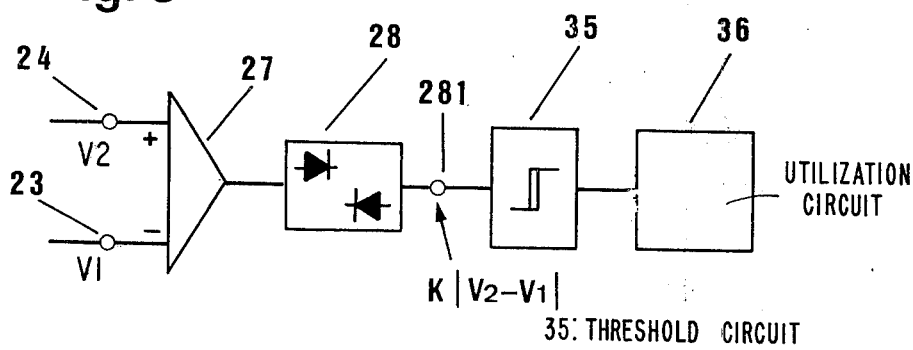
FIG. 5 is another example of embodiment of the output circuit of FIG. 4.

A source 10 delivers a sinusoidal voltage of constant amplitude E to the terminals 13, 14. Terminals 11 and 12 are coupled to 14 by means of a coupling network 9 consisting of fixed resistors. The sinusoidal voltage feeds the third divider (5,6) through the coupling capacitor 15. The sinusoidal voltage at the point 16 common to 5 and 6, of amplitude V, is transferred to points 19 and 20 through the coupling capacitors 17 and 18. The sinusoidal voltages of amplitudes $V_1$ and $V_2$ at the mid-points 21 and 22 of the first and second dividers are applied to the input terminals 23 and 24 of the output circuit 25 which can be designed in various ways which will be described later on (FIGS. 4 and 5). The output of circuit 25 controls a utilization circuit 30.

For the sake of clearness, it should be noted that in current practice the voltages $U_1$ and $U_2$ can vary in one direction or in the other, their ratio remaining between 1 and 20.

It should be recalled, and this will be used to write out the relationship between the output signal from 25 and the ratio $U_1/U_2$, that the differential resistance of a semi-conductor diode, here any one of the diodes 1, 2 and 5, is, with very good approximation, inversely proportional to the current that passes through it.

The conditions (1) and (2) being satisfied, the following equations can be written with a good approximation for the voltages and direct currents $$\left. \begin{array}{l} U_1 = (R7 + R3)I_1 \\ U_2 = (R8 + R4)I_2 \end{array} \right\} \quad (3)$$

As regards sinusoidal voltages, these are all in phase on account of the fact that the circuit does not include any reactive components, except for the coupling capacitors; but the capacity values of the latter are so chosen as to avoid any phase shift; only the amplitudes need therefore be considered, and, designating by V the alternating voltage at point 16 of FIG. 1 and by I the current through diode 5, the following equations are obtained:

$$V = E \frac{R6}{Rd5}$$

$$V1 = V \frac{Rd1}{R3} = E \frac{R6}{R3} \frac{I}{I1}$$

$$V2 = V \frac{Rd2}{R4} = E \frac{R6}{R4} \frac{I}{I2}$$

from which by using (3)

$$V2 - V1 = E\, k\, R6\, I \left( \frac{1}{U2} - \frac{1}{U1} \right) \quad (4)$$

Figure 2:
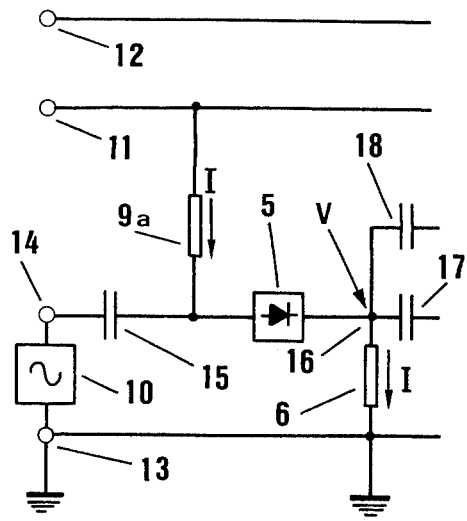
FIGS. 2 and 3 represent two examples of embodiments of a part of the basic diagram of FIG. 1.

Referring now to FIG. 2, the network 9 comprises a single resistor R9a, connected to the terminal 11, and through capacitor 15 to point 14 and such that R9a >> R5 and R9a >> R6

In that case, we may write:

U1 = R9a I and the equation (4) becomes:

$$V2 - V1 = E\, k\, \frac{R6}{R9a} \left( \frac{U1}{U2} - 1 \right) \quad (5)$$

In that case, the output circuit shown in FIG. 4 will be used.

It will be noted that the two values of U1/U2 which correspond to two values of (V2−V1) equal in absolute value, but opposite in sign, are not the reciprocal of one another.

Figure 3:
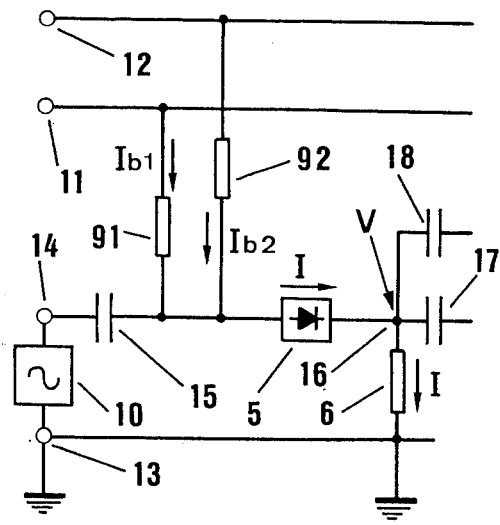

Referring now to FIG. 3, the network 9 comprises two resistors 91 and 92 connected respectively on one hand to the terminals 11 and 12 and on the other hand to capacitor 15, and this in a way such that R91 and R92 >> R5 and R6 whence, designating by Ib1 and Ib2 the D.C. currents through 91 and 92:

$$\left. \begin{array}{l} U1 = R91\ Ib1 \\ U2 = R92\ Ib2 \end{array} \right\} \quad \text{with } I = Ib1 + Ib2$$

In practice, the choice of the values of the resistors is made so that R91 = R92 = R9b, with the result that:

U1 + U2 = R9b (Ib1 + Ib2) = R9b I and the equation (4) becomes:

$$V2 - V1 = E\, k\, \frac{R6}{R9b} \left( \frac{U1}{U2} - \frac{U2}{U1} \right) \quad (6)$$

As in the preceding case, the output circuit described in FIG. 4 may be used. However, it will be noted that the two values of U1/U2 which correspond to the two values of (V2−V1) equal in absolute value, but of different sign, are the reciprocal of one another; that is to say, a single value of $$\left| \log \frac{U1}{U2} \right|$$

corresponds to a value of |V2 − V1|, that is to say of |N1 − N2|, designating by N1 and N2 the logarithmic levels of voltages U1 and U2. If therefore the interest is not on (N1 − N2) but simply on |N1 − N2|, it will be sufficient merely to produce |V2 − V1| by means of the output circuit: this is the case for the circuit described in FIG. 5.

Referring now to FIG. 4, this shows a variant of embodiment of the circuit 25 of FIG. 1. The amplifier 255 is symmetrical and produces a voltage proportional to |V2 − V1| and delivers it to either of the outputs 261, 262 according as to whether V2 is greater or smaller than V1. Such an amplifier can be built in various known manners, with transistors or with operational amplifiers.

In the example shown, the circuit 30 (FIG. 1), comprises: two threshold circuits 31, 32, (whose thresholds correspond to a given level spacing for each direction), a logical gate 33 of the OR type and a utilization circuit 34 which, according to the case, can be a circuit for triggering off an alarm or a signal, a control for regulating the voltages U1 and/or U2, etc. .

Referring now to FIG. 5, which shows another embodiment of the output circuit, the amplifier 27 and the rectifier 28 deliver a direct current voltage at 281, proportional to |V2 − V1| and applied to a threshold circuit 35; the output of the latter controls a utilization circuit 36, which can be similar to 35 of FIG. 4.

Figure 6:
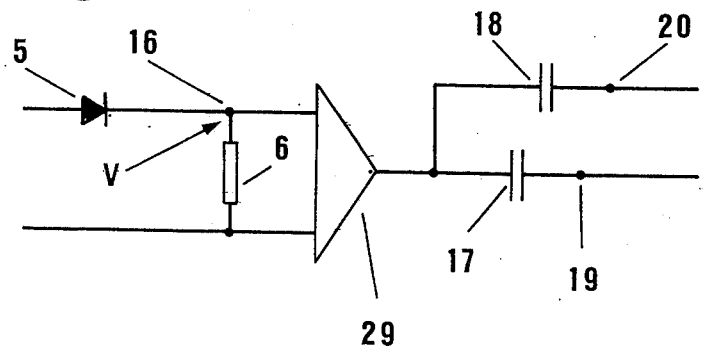
FIG. 6 shows the details of a variant of the basic diagram of FIG. 1.

FIG. 6 shows a variant of the circuit of the invention. If, in FIG. 1, the positions of the components 1, 2 and 6 are inverted with respect to the components 3, 4 and 5 respectively, and if the conditions (1) are replaced by the following:

$$\left. \begin{array}{l} R7 >> R1 \text{ and } R3 \\ R8 >> R2 \text{ and } R4 \\ \\ Rd1 >> R3 \\ Rd2 >> R4 \\ R9a \text{ or } R9b >> R6 >> Rd5 \end{array} \right\} \quad (7)$$

and if the condition (2) is maintained, the equations (5) and (6) become respectively:

$$V2 - V1 = \frac{E}{k} \frac{R9a}{R6} \left( \frac{U2}{U1} - 1 \right) \quad (8)$$

$$V2 - V1 = \frac{E}{k} \frac{R9b}{R6} \frac{\left( \frac{U2}{U1} - 1 \right)}{\left( \frac{U2}{U1} + 1 \right)} \quad (9)$$

which call for the same remarks as the equations (5) and (6).

Another variant of the circuit is also shown in FIG. 6. Since it is essential to amplify the alternating current voltages, before their rectification, in order to obtain voltages of sufficient value proportional to V1, V2 or V2 − V1 , it may be advantageous to amplify beforehand the sinusoidal voltage received at point 16, by means of an amplifier 29 connected in accordance with the drawing, before applying it through capacitors (17,18) to points 20 and 21 of FIG. 1.

What is claimed is:

1. A measurement circuit for measuring the ratio of the magnitudes of two D-C voltages of fixed polarity and translating said ratio into a representing voltage, comprising three voltage dividers connected to a common ground point and each consisting of a fixed resistor and a variable resistor having a resistance value sensitive to the voltage applied thereto, wherein a first and a second of said dividers are respectively fed with direct current by said D-C voltages of fixed polarity, while the third of said dividers is fed with a direct current by means of a further D-C voltage derived from at least one of said D-C voltages of fixed polarity and with an alternating current voltage delivered by a source of constant amplitude, wherein the alternating current voltage appearing at the mid-point of said third divider feeds both said first and second dividers, wherein the series-connection order with respect to ground of said fixed and variable resistors is the same in said first and second dividers and is reversed in said third divider, and wherein the difference between the alternating current voltages received at the mid-points of said first and second dividers is converted into said representing voltage by amplification, rectification and filtering in an output circuit.

2. A measurement circuit according to claim 1, wherein the said variable resistors are semi-conductor rectifying diodes, each one of which is biassed by means of a fixed biassing resistor having a very high resistance value compared with the maximum direct current resistance values of said diodes, said biassing resistor being connected in series with that of said first and second voltage dividers which includes said one of said diodes.

3. A measurement circuit according to claim 2, wherein the variable resistors of said first and second dividers are both connected to said common ground point.

4. A measurement circuit according to claim 2, wherein the variable resistors of said first and second voltage dividers are both connected to a common ground point and wherein the fixed resistors in said first and second voltage dividers are of large resistance values in comparison with the highest possible values of the differential resistances of the diodes included in said first and second dividers, and wherein the fixed resistor of said third voltage divider has a small resistance value compared with the lowest possible values of the differential resistance of the diode included in said third voltage divider.

5. A measurement circuit according to claim 2, wherein the fixed resistors of said first and second dividers are both connected to a common ground point.

6. A measurement circuit according to claim 5, wherein the resistances of said fixed resistors in said first and second voltage dividers are small compared with the smallest possible values of the differential resistances of the diodes included in said first and second dividers and wherein in said third voltage divider the resistance of the fixed resistor is large compared with the highest possible value of the differential resistance of the diode included in said third divider.

7. A measurement circuit according to claim 6, wherein said third voltage divider is fed with a direct current by one of said voltages of fixed polarity through a further fixed resistor of large resistance value compared with the direct-current resistance of the diode included in said third divider.

8. A measurement circuit according to claim 6, wherein said third voltage divider is fed with a direct current by both said voltages of fixed polarity through two further fixed resistors of large resistance value compared with the direct-current resistance of the fixed resistor included in said third divider.

9. A measurement circuit according to claim 2, wherein the ratio of the resistance of said fixed biassing resistor to that of the resistance of said fixed resistor is the same for both said first and second dividers.

10. A measurement circuit according to claim 9, wherein the two alternating current voltages received at the mid-points of said first and second voltage dividers are respectively amplified, rectified and filtered in two distinct similar circuits respectively connected to two inputs of a symmetrical amplifier circuit delivering an amplified signal to either of two outputs, depending on the sign of the difference of the amplitudes of said alternating current voltages, said two outputs being connected to an output and utilization circuit.

11. A measurement circuit according to claim 9, wherein the two alternating current voltages received at the mid-points of said first and second dividers are applied to a linear differential amplifier having an output connected to the input of a rectifying and filtering circuit, the output voltage of which supplies an output and utilization circuit.

* * * * *